(12) United States Patent
Van Boxtel et al.

(10) Patent No.: US 8,675,170 B2
(45) Date of Patent: Mar. 18, 2014

(54) GAS MANIFOLD, MODULE FOR A LITHOGRAPHIC APPARATUS, LITHOGRAPHIC APPARATUS AND DEVICE MANUFACTURING METHOD

(75) Inventors: Frank Johannes Jacobus Van Boxtel, Eindhoven (NL); Pieter Debrauwer, Vught (NL); Antonius Arnoldus Henricus Van Der Steen, Best (NL); Robin Bernardus Johannes Koldeweij, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 195 days.

(21) Appl. No.: 13/406,006

(22) Filed: Feb. 27, 2012

(65) Prior Publication Data

US 2012/0218532 A1   Aug. 30, 2012

Related U.S. Application Data

(60) Provisional application No. 61/447,394, filed on Feb. 28, 2011.

(51) Int. Cl.
*G03B 27/52* (2006.01)
*G03B 27/42* (2006.01)

(52) U.S. Cl.
USPC .............................................. 355/30; 355/53

(58) Field of Classification Search
USPC ................................................ 355/30, 53, 77
See application file for complete search history.

(56) References Cited

U.S. PATENT DOCUMENTS

| | | | |
|---|---|---|---|
| 3,970,962 A | 7/1976 | Peressini et al. | |
| 5,906,429 A | 5/1999 | Mori et al. | |
| 7,375,791 B2 | 5/2008 | Vogel et al. | |
| 7,525,640 B2 * | 4/2009 | Jansen et al. | 355/67 |
| 7,717,229 B2 * | 5/2010 | Putnam | 181/213 |
| 7,961,296 B2 | 6/2011 | Finders | |
| 7,982,856 B2 | 7/2011 | Finders | |
| 8,325,322 B2 * | 12/2012 | Hauf et al. | 355/30 |
| 2005/0264773 A1 | 12/2005 | Beckers et al. | |
| 2007/0002292 A1 | 1/2007 | Vogel et al. | |
| 2008/0073596 A1 | 3/2008 | Derksen et al. | |

(Continued)

FOREIGN PATENT DOCUMENTS

| | | |
|---|---|---|
| JP | 7-057989 | 3/1995 |
| JP | 7-074077 | 3/1995 |

(Continued)

OTHER PUBLICATIONS

Japanese Office Action mailed Apr. 30, 2013 in corresponding Japanese Patent Application No. 2012-036445.

(Continued)

*Primary Examiner* — Hung Henry Nguyen
(74) *Attorney, Agent, or Firm* — Pillsbury Winthrop Shaw Pittman LLP

(57) ABSTRACT

A gas manifold to direct a gas flow between two parallel plates of an optical component of a lithographic apparatus, the gas manifold having an inlet to provide a gas flow to the gas manifold, a lattice comprising a plurality of through holes to homogenize the gas flow, a contractor downstream of the lattice to reduce the cross sectional area through which the gas flow flows, and an outlet downstream of the contractor to provide the gas flow to the two parallel plates.

20 Claims, 8 Drawing Sheets

(56) References Cited

U.S. PATENT DOCUMENTS

| | | |
|---|---|---|
| 2008/0123066 A1 | 5/2008 | Jansen et al. |
| 2008/0137192 A1 | 6/2008 | Soyez et al. |
| 2009/0296060 A1 | 12/2009 | Finders |
| 2009/0316125 A1 | 12/2009 | Finders |
| 2010/0201958 A1 | 8/2010 | Hauf et al. |

FOREIGN PATENT DOCUMENTS

| | | |
|---|---|---|
| JP | H11-195583 | 7/1999 |
| JP | 2001-056268 | 2/2001 |
| JP | 2003-058168 | 2/2003 |
| JP | 2003-142395 | 5/2003 |
| JP | 2003-257826 | 9/2003 |
| JP | 2007-013172 | 1/2007 |
| JP | 2008-053732 | 3/2008 |
| JP | 2009-541998 | 11/2009 |
| JP | 2009-295976 | 12/2009 |
| JP | 2010-010674 | 1/2010 |
| KR | 2002-0009784 | 2/2002 |
| KR | 10-2007-0087667 | 8/2007 |

OTHER PUBLICATIONS

Todd Buxton et al., "The Wandering Wind Tunnel," Barberton High School Presentation, Barberton, Ohio, Chapters 1.0-7.0, 7 pages. (Jan. 30, 1995).

Author Unknown, "Open Circuit Wind Tunnels," Aerolab Brochure, 4 pages (2010).

Vinayak Kulkarni et al., "Simulation of honey comb—screen combinations for turbulence management in a subsonic wind tunnel," J. Wind Eng. Ind. Aerodyn., pp. 34-45 (2011).

Johan Groth et al., "Turbulence reduction by screens," J. Fluid Mech., vol. 197, pp. 139-155 (1988).

A. Mosyak et al. "Effect of Constant Heat Flux Boundary Condition on Wall Temperature Fluctuations," J. Heat Transfer, vol. 123, pp. 213-218 (Apr. 2001).

W.J. Minkowycz et al., "Numerical simulation of laminar breakdown and subsequent intermittent flow in parallel-plate channels: Effects of inlet velocity profile and turbulence intensity," International Journal of Heat and Mass Transfer, vol. 52, pp. 4040-4046 (2009).

M.A. Karnitz et al., "An Experimental Investigation of Transition of a Plane Poiseuille Flow," J. Fluids Eng., Transactions of the ASME, pp. 384-388 (Dec. 1974).

D.G. MacManus et al., "Measurement and Analysis of the Flowfields Induced by Suction Perforations," AIAA Journal, vol. 36, No. 9, pp. 1553-1561 (Sep. 1998).

D.G. MacManus et al., "Flow physics of discrete boundary layer suction-measurements and predictions," J.Fluid Mech., vol. 417, pp. 47-75 (2000).

A. Elofsson et al., "Experiments on the stability of streamwise streaks in plane Poiseuille flow," Physic's of Fluids, vol. 11, No. 4, pp. 915-930 (Apr. 1999).

Fredrik Lundell et al., "Experiments on control of streamwise streaks," European Journal of Mechanics B/ Fluids, vol. 22, pp. 279-290 (2003).

P.W. Carpenter et al., "Hydrodynamics and compliant walls: Does the dolphin have a secret?" Current Science, vol. 79, No. 6, pp. 758-765 (Sep. 25, 2000).

Jerome Hoepffner et al., "Mechanisms of non-modal energy amplification in channel flow between compliant walls," J. Fluid Mech., vol. 642, pp. 489-507 (2010).

Mihailo R. Jovanovic, "Turbulence suppression in channel flows by small amplitude transverse wall oscillations," Physics of Fluids, vol. 20, pp. 014101-1-014101-11 (2008).

S.J. Lee et al., "Flow field analysis of a turbulent boundary layer over a riblet surface," Experiments in Fluids, vol. 30, pp. 153-166 (2001).

Christopher Davies et al., "Instabilities in a plane channel flow between complaint walls," J. Fluid Mech., vol. 352, pp. 205-243 (1997).

Korean Office Action dated Oct. 28, 2013 in corresponding Korean Patent Application No. 10-2012-0019741.

\* cited by examiner

GAS MANIFOLD, MODULE FOR A LITHOGRAPHIC APPARATUS, LITHOGRAPHIC APPARATUS AND DEVICE MANUFACTURING METHOD

This application claims priority and benefit under 35 U.S.C. §119(e) to U.S. Provisional Patent Application No. 61/447,394, entitled "Gas Manifold, Module For A Lithographic Apparatus, Lithographic Apparatus and Device Manufacturing Method", filed on Feb. 28, 2011. The content of that application is incorporated herein in its entirety by reference.

FIELD

The present invention relates to a gas manifold, a module for a lithographic apparatus, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In IC fabrication, the continuing improvements in microprocessor speed, memory packing density and low power consumption for micro-electronic components require a continuing decrease of size of the patterns that are transferred from the patterning device to the substrate by the lithographic apparatus. As the size of an integrated circuit is reduced and its density increases, however, the CD (critical dimension) of its corresponding patterning device pattern approaches the resolution limit of the lithographic apparatus. The resolution for a lithographic apparatus is defined as the minimum feature that the apparatus can repeatedly expose on the substrate. Various techniques, known as resolution enhancement techniques, have been applied in order to extend the resolution limit of the lithographic apparatus.

One technique to improve resolution is off-axis illumination. With this technique, the patterning device is illuminated at a selected non-perpendicular angle which may improve resolution, and particularly improves the process latitude by increasing the depth of focus and/or contrast. The angular distribution at the patterning device plane, which is an object plane, corresponds to a spatial distribution in a pupil plane of the optical arrangement of the lithographic apparatus. Typically, the shape of the spatial distribution in a pupil plane is referred to as an illumination mode. One known illumination mode is annular, in which the conventional zero order spot on the optical axis is changed to a ring-shaped intensity distribution. Another mode is multipole illumination in which several spots or beams are produced which are not on the optical axis. Examples of multipole illumination modes are dipole, comprising two poles and quadrupole, comprising four poles.

SUMMARY

For illumination modes such as dipole and quadrupole, the size of the poles in the pupil plane can be very small compared to the total surface of the pupil plane. Consequently, substantially all of the radiation used for exposing the substrate traverses the various optical elements at or near the pupil planes at the locations of these poles only. A fraction of the radiation traversing one or more optical elements (e.g., one or more lenses) is absorbed by the element(s). This leads to a non-uniform heating of the element(s) by the radiation beam, resulting in a local change in refractive index or reflectivity and a deformation of the element(s). The local change in refractive index or reflectivity and deformation of the element(s) may result in a distorted aerial image as projected by the projection system onto the substrate, e.g., the resist layer on the substrate. U.S. Pat. No. U.S. 7,525,640, the entirety of which is hereby incorporated by reference, proposes a solution to the abovementioned problem.

A possible solution to non-uniform heating is to provide, for example, an optical component transverse to and in the path of the beam of radiation. The optical component comprises a first plate with an individually addressable electrical heat transfer devices configured locally to heat and/or cool the plate, and generally the optical component. The refractive index, reflectivity or deformation of the plate and/or generally the optical component can be changed by changing its temperature at local positions. A further plate in parallel to the first plate may be provided, for example as part of the optical component. A flow of gas is provided between the two parallel plates. This reduces the transfer of heat in a direction perpendicular to the radiation beam. Otherwise heat may be transferred from positions with a high temperature to positions with a lower temperature due to conduction which reduces the gradient of the change in refractive index, reflectivity or deformation achievable. As such, the gas (e.g., cold gas) is used as an offset against the heat transfer devices. In an embodiment, the gas is at substantially the same temperature (which may be a certain temperature) as the optical component (e.g. 22° C.) so as not to disturb the thermal equilibrium of the optical component, which may be a lens. Additionally, providing the gas at a temperature lower than ambient temperature, two-sided correction (i.e. heating and cooling) is obtainable.

It is desirable, for example, to provide a gas manifold in which measures are taken to stabilize a gas flow provided between at least two parallel plates of an optical component of a lithographic apparatus.

According to an aspect of the invention, there is provided a gas manifold to direct a gas flow between at least two parallel plates of an optical component of a lithographic apparatus, the gas manifold comprising: an inlet to provide a gas flow to the gas manifold; a lattice comprising metal and comprising a plurality of through holes to homogenize the gas flow; a contractor downstream of the lattice to reduce the cross sectional area through which the gas flow flows; and an outlet downstream of the contractor to provide the gas flow to the at least two parallel plates.

According to an aspect of the invention, there is provided a gas manifold to direct a gas flow between at least two parallel plates of an optical component of a lithographic apparatus, the gas manifold comprising: an inlet to provide a gas flow to the gas manifold; a lattice comprising a plurality of through holes in a regular periodic structure to homogenize the gas flow; a contractor downstream of the lattice to reduce the cross sectional area through which the gas flow flows; and an outlet downstream of the contractor to provide the gas flow to the at least two parallel plates.

According to an aspect of the invention, there is provided A device manufacturing method comprising: projecting a patterned beam of radiation onto a target portion of a substrate using a projection system; locally changing an optical path length of the beam of radiation using a plate arranged transverse to and in the path of the beam of radiation, the plate being heated locally; and providing a gas flow through a lattice comprising metal and a plurality of through holes to homogenize the gas flow, a contractor and between the plate and a further plate parallel thereto.

According to an aspect of the invention A device manufacturing method comprising: projecting a patterned beam of radiation onto a target portion of a substrate using a projection system; locally changing an optical path length of the beam of radiation using a plate arranged transverse to and in the path of the beam of radiation, the plate being heated locally; and providing a gas flow through a lattice comprising a plurality of through holes in a regular periodic structure to homogenize the gas flow, a contractor and between the plate and a further plate parallel thereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
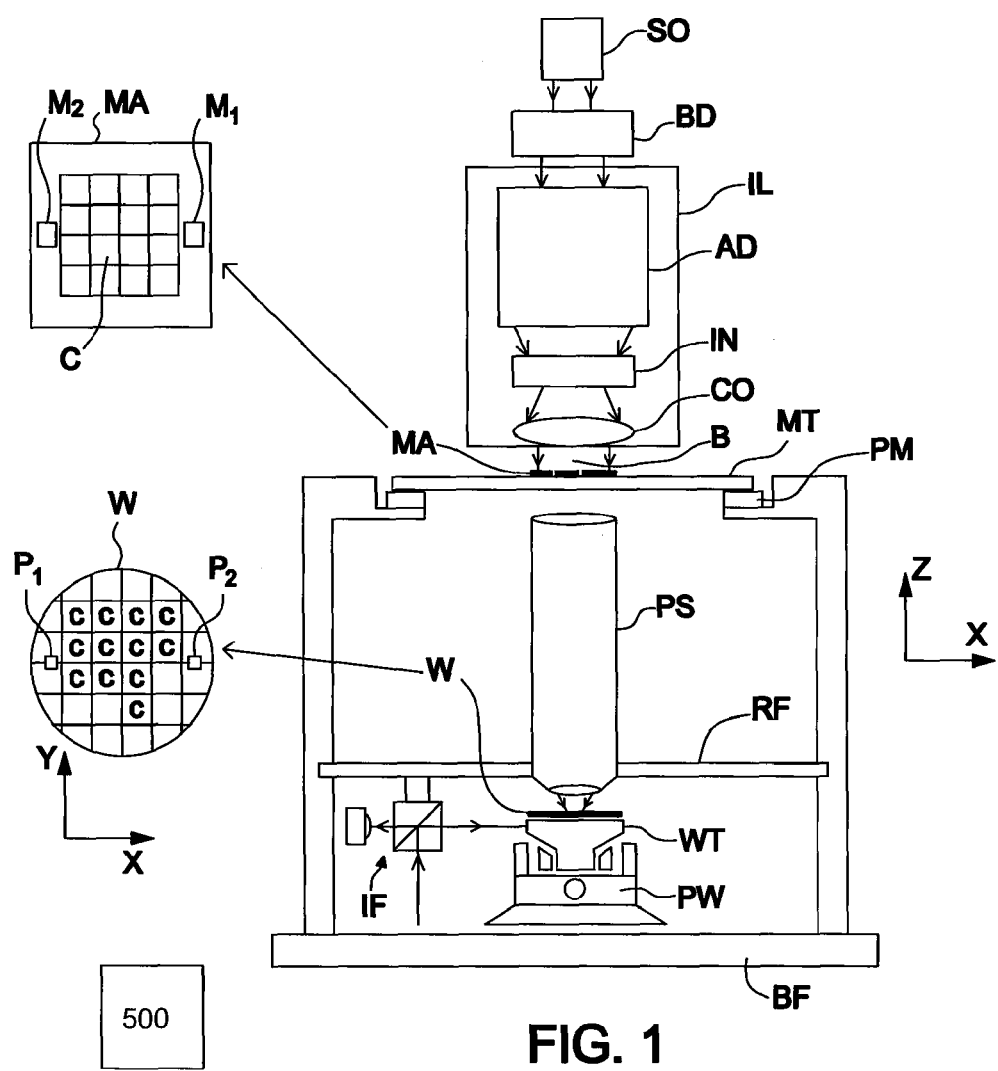
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, catadioptric, magnetic, electromagnetic, electrostatic or other types of optical components, or any combination thereof, for directing, shaping, and/or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The intensity distribution of the radiation beam may comprise a plurality of poles, defining the portion of the cross-section of the pupil plane through which substantially all radiation of the radiation beam traverses the pupil plane. In the following description, the intensity distribution of the radiation beam in a pupil plane is referred to as an illumination mode. In an embodiment the intensity distribution is a dipole illumination mode (2 poles). In an embodiment the intensity distribution is a quadrupole illumination mode (4 poles).

As the radiation beam traverses a refractive optical element (e.g., a lens) or a reflective optical element (e.g., a mirror), a small portion of the radiation beam is absorbed by the element. The absorption of the radiation beam by the element causes the element to heat up. Heating of the element results in a change in refractive index or reflectivity of the element at the location of absorption and a deformation of the element. For an element positioned at a location where the radiation beam traverses the element uniformly, this absorption results in a uniform heating of the element and a uniform change in refractive index or reflectivity and deformation. This can be detrimental, especially for non-parallel elements (e.g. convex or concave elements). For an element positioned at or near a pupil plane, the portion of the cross-section of the element via which the radiation beam traverses the element is dependent on the applied illumination mode. For an illumination mode such as dipole or quadrupole, the element absorbs radiation non-uniformly across the surface of the element, causing a non-uniform change in refractive index or reflectivity and deformation of the element. The local changes in refractive index or reflectivity and deformation of one or more elements in the projection system may result in a change in optical path length of different portions of the radiation beam traversing the elements. The changes in optical path length differences causes the portions of the radiation beam to recombine into an aerial image at substrate level that is distorted with respect to the object image at patterning device level due to an optical path length difference between the recombining portions of the radiation beam. An example of an imaging parameter that is negatively affected by this difference is the field position dependent focus offset. While discussion herein focuses on transmissive optical elements and refractive index, the embodiments herein may be appropriately be applied to reflective optical elements. For example, rather than radiation passing through one or more of the plates described hereafter, the radiation may be reflected by one or more the plates described hereafter.

Figure 2:
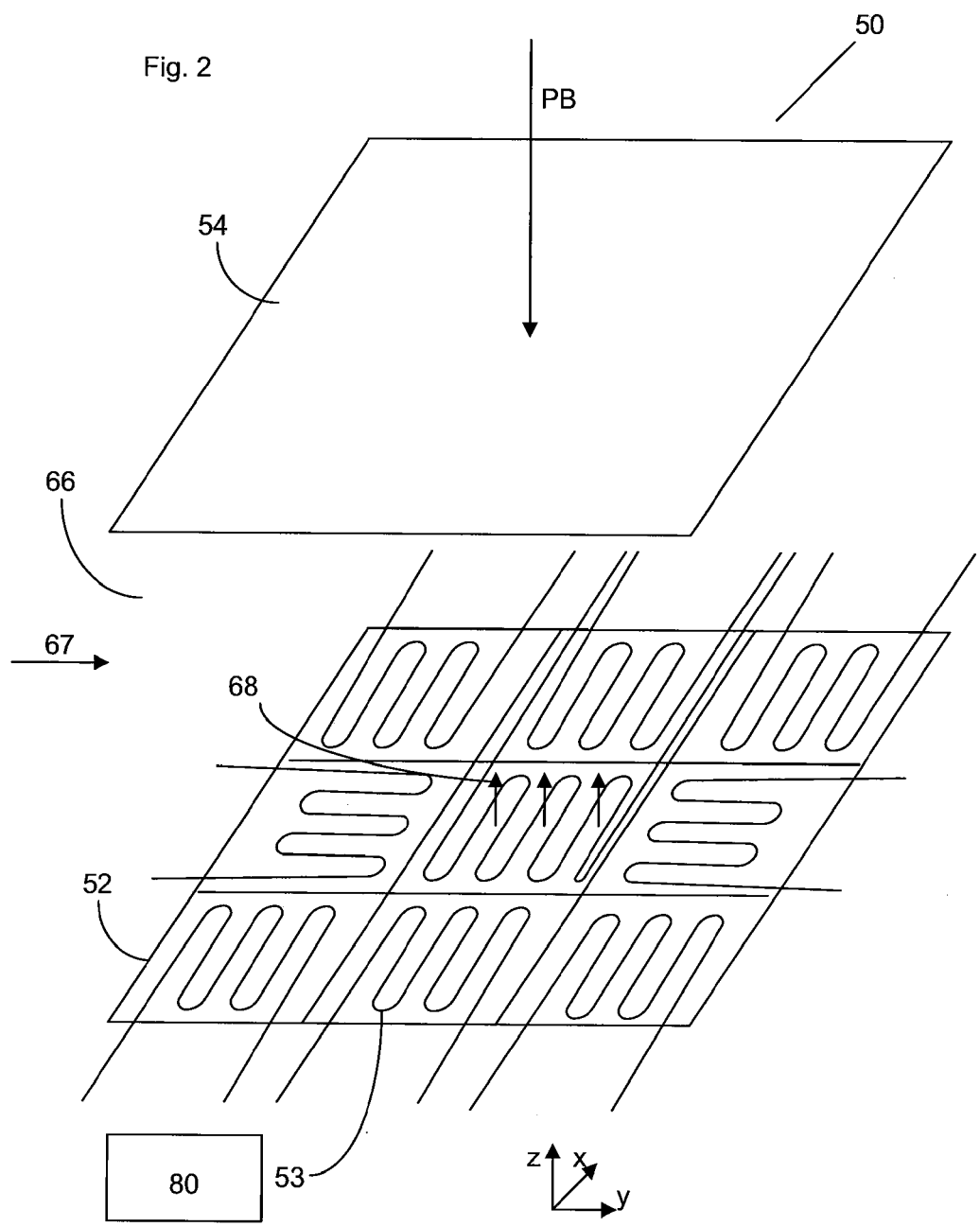
FIG. 2 illustrates, in perspective view, an optical component of a lithographic apparatus comprising two parallel plates.

FIG. 2 shows an embodiment of an optical component 50 comprising at least two parallel plates 52, 54. At least one parallel plate 52 comprises electrical heat transfer devices 53 (e.g., heating devices in the form of conductors, for example meandered conductors comprising, for example, parallel filaments). The electrical heat transfer devices 53 are electrically connected to a control unit 80 and are separated from each other. The control unit 80 addresses each electrical heat transfer device of the electrical heat transfer devices (nine are shown) using a known time multiplexing addressing technique to generate a desired amount of heat transfer in the associated portions of the optical element. The optical component 50 may comprise any number of electrical heat transfer devices. The optical component 50 thereby allows the creation of locally warmer and cooler areas in the cross section of the projection beam PB. This ability can be used to counter heating of an optical element (e.g., lens) (herein generally referred to as lens heating) elsewhere by off-setting that lens heating. Lens heating can result from the passage of the projection beam PB via a local area of the lens, for example. Additionally or alternatively this ability can be used for correcting for lens lifetime effects and/or image enhancement techniques.

The transfer of heat within the optical component 50 in a direction perpendicular to the radiation beam PB is desirably minimal. For this purpose and others, a channel 66 confined by the plates 52 and 54 is arranged to create a heat transfer within the optical component 50 substantially in a direction parallel to the radiation beam PB as indicated by arrows 68. This is achieved by guiding a fluid, for example a (ultra-high-purity) gas such as any non-reactive gas, such as a gas comprising substantially $N_2$ or He, from a supply through the channel 66 as indicated by arrow 67. In an embodiment the gas is kept at a lower temperature than the optical component 50. Typically, the channel 66 will have dimensions in X and Y directions comparable to the size of the optical component 50 and a height in Z-direction of less than 12 mm or 10 mm, typically about 7 mm. The temperature of the gas may be kept substantially constant using a known temperature control device arranged between the gas supply 14 (shown in FIG. 3) and the optical arrangement. The gas may be reused by enabling a circulation loop wherein the gas after passing the optical component is transported back to the gas supply 14.

To enable two-sided correction and keep the optical component as a whole at a certain average temperature (which may be predetermined), a heat transfer (e.g., cooling) power bias is used. This is supplied by the (ultra-high-purity) gas flow of several hundreds of litres per minute (for example if XCDA is used; a lower flow rate can be used if He is used). The gas flow may have a cooling function. The gas is supplied via a gas manifold 10 illustrated in FIG. 3. The gas is provided to the gas manifold 10 via an inlet 12. Gas is provided to the inlet from the gas supply 14. The velocity of gas in the hose between the gas supply 14 and the inlet 12 is bound to a certain allowable upper limit.

Figure 3:
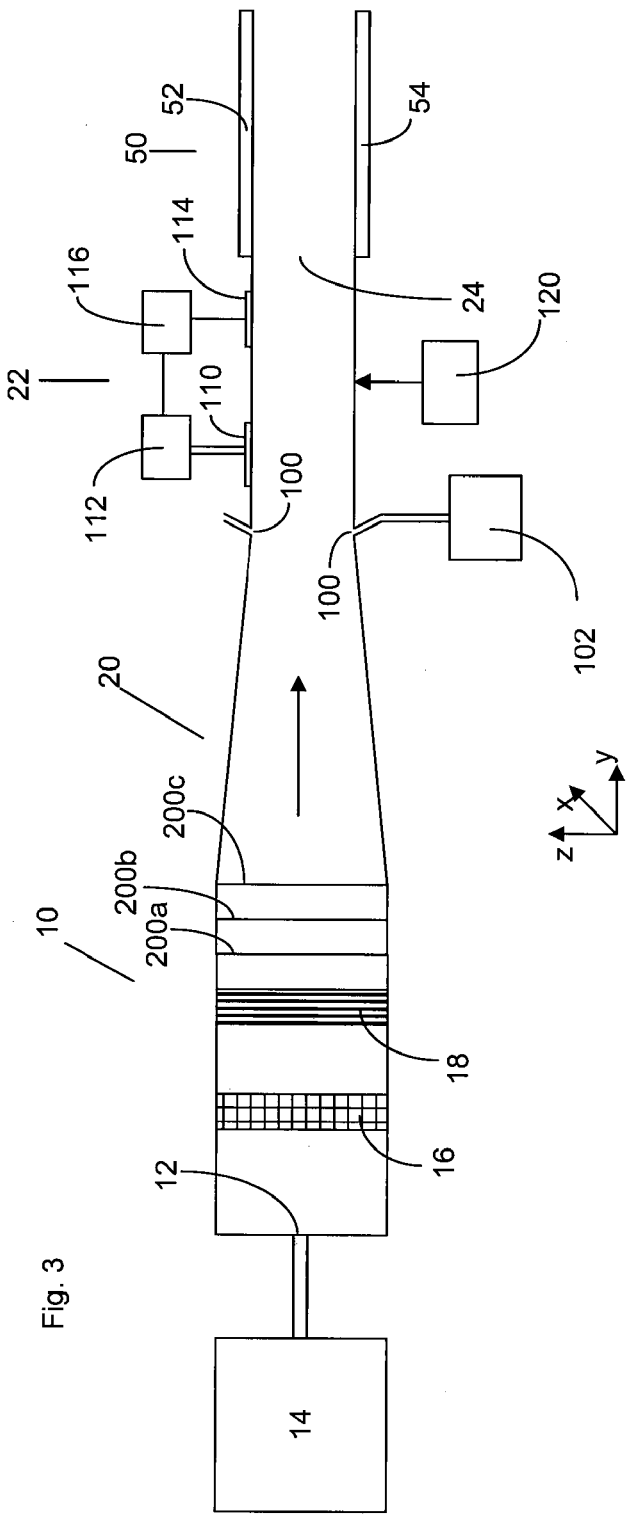
FIG. 3 illustrates a gas manifold, an optical component and a gas flow path of an embodiment of the present invention.

Turbulence in the flow of gas between the at least two parallel plates 52, 54 may be detrimental to the wavefront stability and thereby the functionality of the optical component 50. An embodiment of the present invention provides an improvement of the gas manifold disclosed in U.S. patent application No. U.S. 61/394,444 filed 19 Oct. 2010, the entire contents of which is hereby incorporated by reference. Parts of the gas manifold of U.S. patent application No. U.S. 61/394,444 are illustrated in FIG. 3. The gas manifold 10 comprises, downstream of the inlet 12 a diffuser 16. The diffuser 16 may be in any form which provides a pressure drop, for example a member with a plurality of through holes such as a porous (metal) plate to provide a pressure drop (of several bar). This helps keep the upstream pressure high thereby allowing a lower gas velocity at higher pressure from the gas supply 14. Additionally, the diffuser 16 results in a substantially uniform flow rate of gas over its cross-sectional area out of the diffuser 16 on its downstream side.

Downstream of the diffuser 16 is a flow straightener 18. The flow straightener 18 is for further straightening the flow of gas so that the gas all flows in substantially parallel directions. The flow straightener 18 damps fluctuations perpendicular to the flow direction. The flow straightener 18 increases performance by reducing the magnitude or occurrence of spanwise temperature modulations by decreasing turbulence. The flow straightener 18 comprises a plurality of passages for the flow of gas therethrough. In one embodiment the flow straightener 18 has an open area ratio (the ratio of passageway to material in cross-section) of greater than or equal to 0.5, desirably greater than 0.55 or even larger than 0.6. In an embodiment the flow straightener is a honeycomb flow straightener. For a honeycomb flow straightener, the open area ratio is typically 0.5-0.6, with a relatively small hole diameter. An optimal length L for the passages through the flow straightener 18 relative to the hydraulic diameter D of the passages is typically between 5 and 15, desirably between 8 and 12. The hydraulic diameter (calculated as four times the cross sectional area of a passage divided by the perimeter length of the passage) is between 0.5 and 1.5 mm. A honeycomb flow straightener has passages with a hexagonal cross section.

Downstream of the flow straightener 18 is a contractor 20. The contractor 20 reduces the intensity of turbulence in the flow of gas through it. This is a result of increasing the velocity of the gas, so that relative velocity fluctuations are lower and also because of a phenomenon known as vortex tube stretching. Vortex tube stretching induces faster decay of larger flow structures. The cross sectional area of the contractor 20 through which the gas flow flows, becomes smaller further downstream. This reduces the intensity of turbulence in the gas flow.

In an embodiment the contractor 20 is a planar contractor. That is, the contraction only occurs in one direction (the z direction) and there is no contraction in the orthogonal direction perpendicular to the flow direction (the x direction as illustrated). This means that the size of the contractor 20 in z-direction is reduced further downstream. The size in the x-direction does not change. A planar contractor 20 has an advantage that it takes up less space than a 3-D contractor. In an embodiment the contractor 20 may also contract in the x direction (i.e. be a 3D contractor).

An inlet section 22 (which may be a separate component to the manifold 10) is provided downstream of an outlet of the contractor 20. In an embodiment the inlet section 22 has a substantially constant cross-sectional shape. In an embodiment the inlet section 22 has converging (in the z-axis) upper and lower (flat) plates to help further stabilize the flow.

An outlet 24 is provided at the end of the inlet section 22 downstream of the diffuser 16, flow straightener 18, contractor 20 and inlet section 22. The outlet 24 is connected to the optical component 50. The gas flow then passes into the channel 66.

Generally a contraction ratio (the ratio of the cross sectional area at an inlet side of the contractor 20 to the cross sectional area of the outlet side of the contractor 20) of 4-6 may be provided. This may result in the largest turbulence reduction, at least for axisymmetric contraction. However, the planar contraction of the gas manifold of FIG. 3 may perform better with a contraction ratio of between 1.5 and 3, or between 2 and 3.

Nevertheless, turbulence may still exist for very high flow rates and flow instabilities, e.g., Klebanoff modes may still be excited. These instabilities can result in stream-wise orientated optical phase streaks (a span-wise optical path length modulation) in the optical area. This can lead to functional limitations of the optical component 50. The presence of the streaks may be due to a span-wise temperature modulation present in the gas flow. This modulation is due to vortex streaks developing in the gas close to the walls of the gas manifold 10 defining the flow path of the gas flow through the gas manifold. This results in a non-uniform heat pickup at the walls.

The formation of the streaks occurs in this type of flow when the Reynolds number (Re) is in the transitional or low-turbulent phase (Re being between 4,000 and 6,000) and when the level of disturbances is high enough to induce them and allow their growth, but not too large to cause breakdown of coherent structures. The boundary conditions and heat transfer power requirements (e.g., cooling power requirements) of the gas manifold 10 however dictate a geometry and flow velocity that results in this transitional or low-turbulence Reynolds number when air or a similar gas is used as the heat transfer medium. Further measures can be taken in the gas manifold 10 to address these issues as described below.

U.S. patent application No. U.S. 61/394,444 describes several measures which may be taken in the inlet section 22 to address stream-wise orientated optical phase streaks. An embodiment of the present invention may be used additionally to those measures or instead of those measures.

An embodiment of the present invention is directed to at least one lattice, grid or screen 200a, 200b, 200c which is positioned upstream of the contractor 20. In the FIG. 3 embodiment the lattice is positioned downstream of the flow straightener 18. However, in an embodiment at least one lattice 200a, 200b, 200c may be positioned upstream of the flow straightener 18 (and downstream of the diffuser 16). In an embodiment the lattice 200 is positioned downstream of the flow straightener 18. This is because the flow straightener 18 may introduce inhomogeneities (e.g. minor turbulence, e.g. vortex shedding) in the flow which the lattice 200 is intended to reduce or eliminate. However, the aggregate effect of the straightener 18 is positive. Furthermore, a lattice(s) downstream of the straightener can remove or reduce the turbulences, but that it/they do(es) more than that. Besides removing those, the lattice(s) bring(s) down the turbulence level of the entire flow even further.

The at least one lattice 200a, 200b, 200c promotes flow uniformity and reduces turbulence.

U.S. patent application No. U.S. 61/394,444 suggests that one or more permeable membranes made of cloth may be spanned over the flow area either upstream or downstream (or both) of the flow straightener 18. The one or more lattices herein are similar to a cloth. The lattices 200a, 200b, 200c may comprise a plurality of regularly spaced through holes and promote homogenizing the gas flow. That is, the through holes are in a regular (two dimensional) periodic structure. Such a structure promotes flow uniformity and reduces turbulence. In an embodiment, the lattice is rigid so that the regular periodic structure is maintained. The lattice has structural integrity so that the regularity is not disturbed in handling the lattice for manufacturing and/or cleaning.

In an embodiment, the lattices may be made of metal. As will be illustrated below, this results in improved elimination of stream-wise orientated optical phase streaks. This is in part due to high open area ratio compared to cloth screens. Additionally, advantages of metal are cleanability, durability, and the fact that due to the higher thermal conduction, metal helps in making the temperature more uniform as well. A further advantage of the metal lattice is that temperature conduction through the metal lattice helps to reduce temperature variation between the walls of the manifold.

Figure 4:
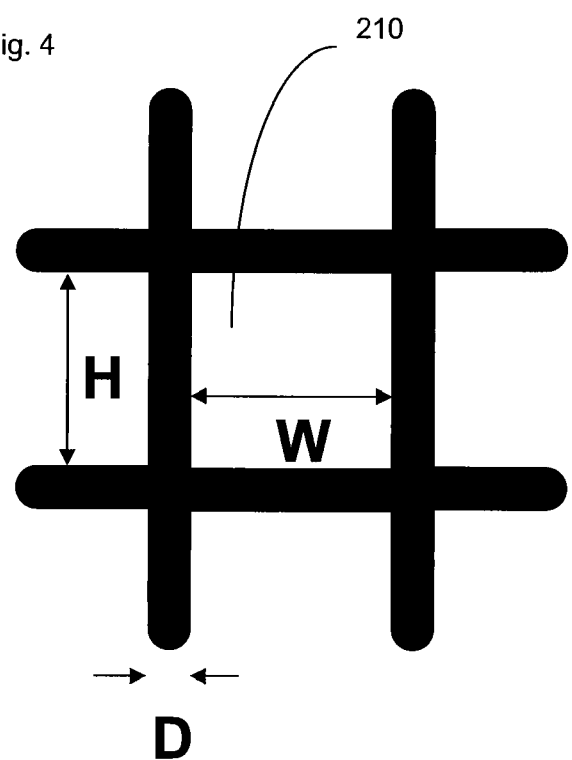
FIG. 4 illustrates schematically a throughhole of a lattice.

Experiments using various different lattices have shown variations in performance of elimination of stream-wise orientated optical phase streaks. FIG. 4 illustrates schematically a through hole 210 of a lattice which has a regular periodic structure so that through holes 210 are regularly spaced and/or periodically spaced. Dimensions of the lattice include a height H of the through hole 210, a width W of the through hole 210 and a dimension D of the material (e.g. filament) defining the through hole 210.

The table below illustrates dimensions D, H and W for a plurality of different lattices L1-L8 and includes an open area ratio $A_{ratio}$ calculated for each lattice. The open area ratio is defined as the area of the opening divided by the total area. A mesh size (usually measured in filaments per inch) can be defined from these dimensions and is given, as is a through hole hydraulic diameter to filament diameter ratio $D_H/D$ (assuming round wires). Lattices L3 and L4 have an irregular weave, lattices L1-L4 are cloth lattices and lattices L5-L8 are metal lattices with a regular weave. In particular the lattices of L5, L6, L7 and L8 are made of austenitic steel and have a regular periodic structure.

The properties of the lattices are as illustrated below.

| Number | W [μm] | H [μm] | D [μm] | $A_{ratio}$ | Mesh size filaments per inch (and filaments per m) | $D_{H(\mu m)}$ | $D_H/D$ |
|---|---|---|---|---|---|---|---|
| L1 | ~10 | ~10 | ~40 | 0.04 | 508 (20000) | 10 | 0.25 |
| L2 | ~40 | ~40 | ~75 | 0.12 | 220 (8660) | 40 | 0.53 |
| L3 | No opening | No opening | 50-150 | NA | NA | | |
| L4 | No opening | No opening | 100 | NA | NA | | |
| L5 | ~70 | ~70 | ~55 | 0.33 | 203 (7990) | 70 | 1.27 |
| L6 | ~90 | ~90 | ~60 | 0.36 | 170 (6690) | 90 | 1.50 |

-continued

| Number | W [μm] | H [μm] | D [μm] | $A_{ratio}$ | Mesh size filaments per inch (and filaments per m) | $D_{H(\mu m)}$ | $D_H/D$ |
|---|---|---|---|---|---|---|---|
| L7 | ~75 | ~75 | ~50 | 0.37 | 203 (7990) | 75 | 1.50 |
| L8 | ~75 | ~75 | ~35 | 0.46 | 230 (9060) | 75 | 2.14 |

Figure 5:
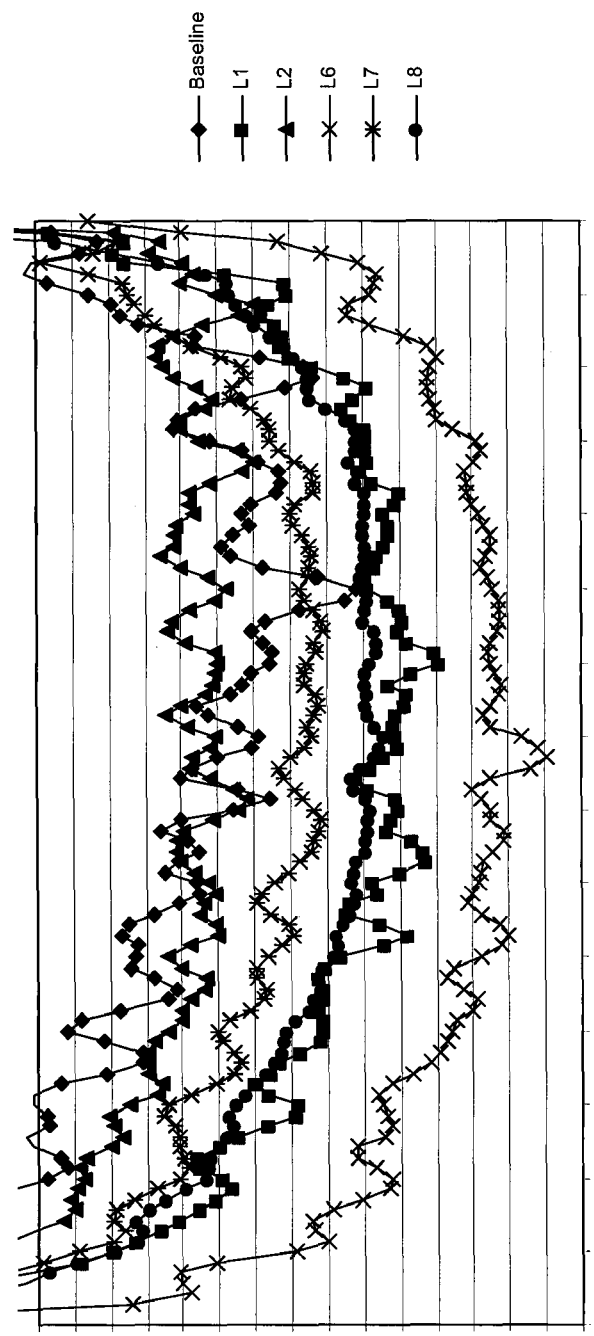
FIG. 5 illustrates temperature variation values for a gas manifold with different screens.

FIG. 5 illustrates experimental results of temperature variations in gas for gas manifolds set up as in FIG. 3 using different lattices. The graph shows the variation in temperature (on the vertical axis) with a location (on the horizontal axis). The temperature at the upper wall of the outlet side 24 of the inlet section 22 is shown. The results are plotted for measurements taken with a single lattice of each of L1, L2, L6, L7 and L8 and for the case where no lattice is in place. The lattices irregular weave are not expected to perform well.

From FIG. 5 it is possible to determine a temperature variation (dT) in a zone in the middle (in the X direction) of the outlet side 24 (i.e. excluding the outer edges where the temperature profile is affected by contact with the side walls of the gas manifold).

| Lattice | dT (° C.) |
|---|---|
| Baseline (no screen) | ±0.7 |
| L1 | ±0.35 |
| L2 | ±0.3 |
| L6 | ±0.3 |
| L7 | ±0.2 |
| L8 | ±0.1 |

The results show that the best performance is achieved with lattices L7 and L8. This is thought to be because their open area ratio is high (0.37 or higher). Even better performance is achieved with an open area ratio of above 0.4.

As can be seen, the higher the open area ratio, the better the performance. Theoretically the optimal open area ratio is 0.58. However, this may be difficult to achieve practically. Therefore an open area ratio of 0.37 or greater is used. If the open area ratio is too low this can lead to jets of gas exiting adjacent through holes interacting and thereby causing turbulence. Therefore in an embodiment the open area ratio is less than or equal to 0.7, or desirably less than or equal to 0.6. If the open area ratio is too high the lattice will not perform its primary function of flow homogenization and turbulence reduction. Interacting jets is also a problem with non-regular lattices.

In an embodiment the thermal conductivity of the material of the lattice is greater than or equal to 10 W/m/K, desirably greater than or equal to 20 or 25 W/m/K. This helps in reducing thermal spatial variations.

Suitable materials for the lattice 200 are aluminum and aluminum alloys, austenitic stainless steel (e.g. 304 or 316), crystal quartz, ferrite (with a shield for sulphur content), NBK 7 (silica), PTFE, polycarbonate (UV protected), S-LAH 52 (silica) and/or Zerodur glass ceramic. Of those, the stiffest ones and the ones with high thermal conductivity (i.e. the metals) are desirable.

Any way of manufacturing the lattice is possible. For example, the lattice could just be two layers of filament laid across one another with some way of attaching them together in order to provide the necessary rigidity. The lattice could be as a single component for example using three-dimensional printing.

The lattice L6 with its open area ratio comparable to that of L7 and L8 is thought to not perform as well as L7 and L8 partly because the mesh size of the lattice is too small (that is, the through holes are too big) thereby possibly not being effective to homogenize the flow uniformity and reduce turbulence (reducing flow oscillations in the flow direction).

For a square through hole, the hydraulic diameter $D_H$ can be estimated as the width of the through hole. A hydraulic diameter of 70 μm or above is desirable. A suitable through hole hydraulic diameter $D_H$ to filament diameter ratio $D_H/D$ of a lattice is 1.0 or greater, 1.4 or greater, 1.8 or greater, or 2.0 or greater.

Figure 6:
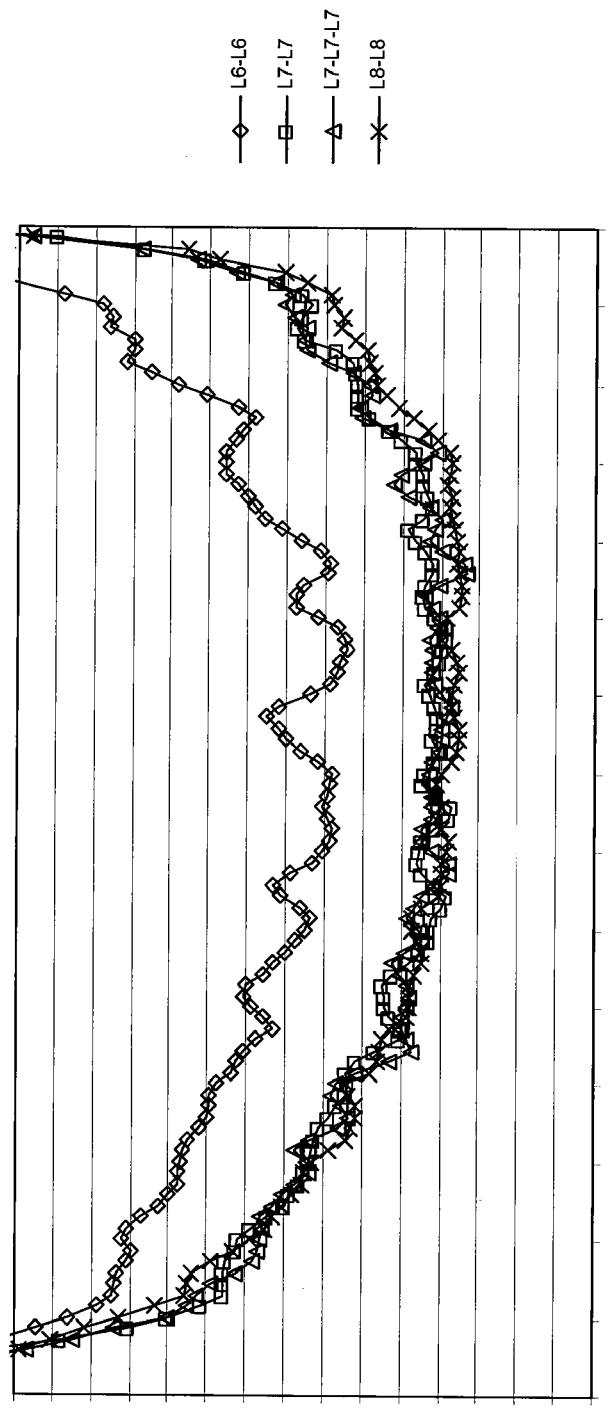
FIG. 6 illustrates temperature variation values for a gas manifold with different combinations of lattice and an inlet with walls of poly(methyl methacrylate) (PMMA)

As illustrated in FIG. 3, more than one lattice 200a, 200b, 200c may be employed. Multiple lattices are placed in series. FIG. 6 shows the results for different arrangements of multiple lattices in a similar graph to that of FIG. 5. The below results illustrate the improved performance of using multiple lattices (see for example two screens L7-L7 which show an improved performance over a single L7). Three L7 lattices do not show improved performance over two L7 lattices. The best performance may be achieved by using two lattices with the highest available open area ratio and highest through hole hydraulic diameter to filament diameter ratio.

| Lattice | dT (° C.) |
|---|---|
| Baseline (no screen) | ±0.7 |
| L6-L6 | ±0.3 |
| L7-L7 | ±0.15 |
| L8-L8 | ±0.1 |
| L7-L7-L7 | ±0.15 |

Too many lattices do not help greatly as it increases the chance of a manufacturing error. Two to three lattices is likely, five the probable maximum.

Using a number of less restrictive lattices is desirable over using a single more restrictive lattice to create a pressure drop, homogenize the flow and reduce turbulence. If more lattices are used, the open area ratio of these lattices can be different. If this is the case, an optimal arrangement may be achieved by stacking the lattices from most to least restrictive, i.e. from low to high open area ratio.

Lattices are mounted tautly, so as to not disturb the (developing) boundary layer.

In an embodiment between lattices 200a, 200b, 200c, but also between the flow straightener 18 and the first lattice 200a and between the last lattice 200a and the contractor 20, a certain distance is present. The certain distance x can be calculated as follows: $x=0.2D_h$, in which $D_h$ is the hydraulic diameter of the flow channel and equal to $$D_h = \frac{4A}{P},$$

in which A is the cross-sectional flow area and P the flow channel perimeter. For slit flows (as in the gas manifold), the hydraulic diameter can be estimated by $D_h=2h$, in which h is the channel height. Using the first equation for the hydraulic diameter, one obtains $D_h=25$ [mm] and thus a distance x of 5 [mm] for typical dimensions of the gas manifold.

Figure 7:
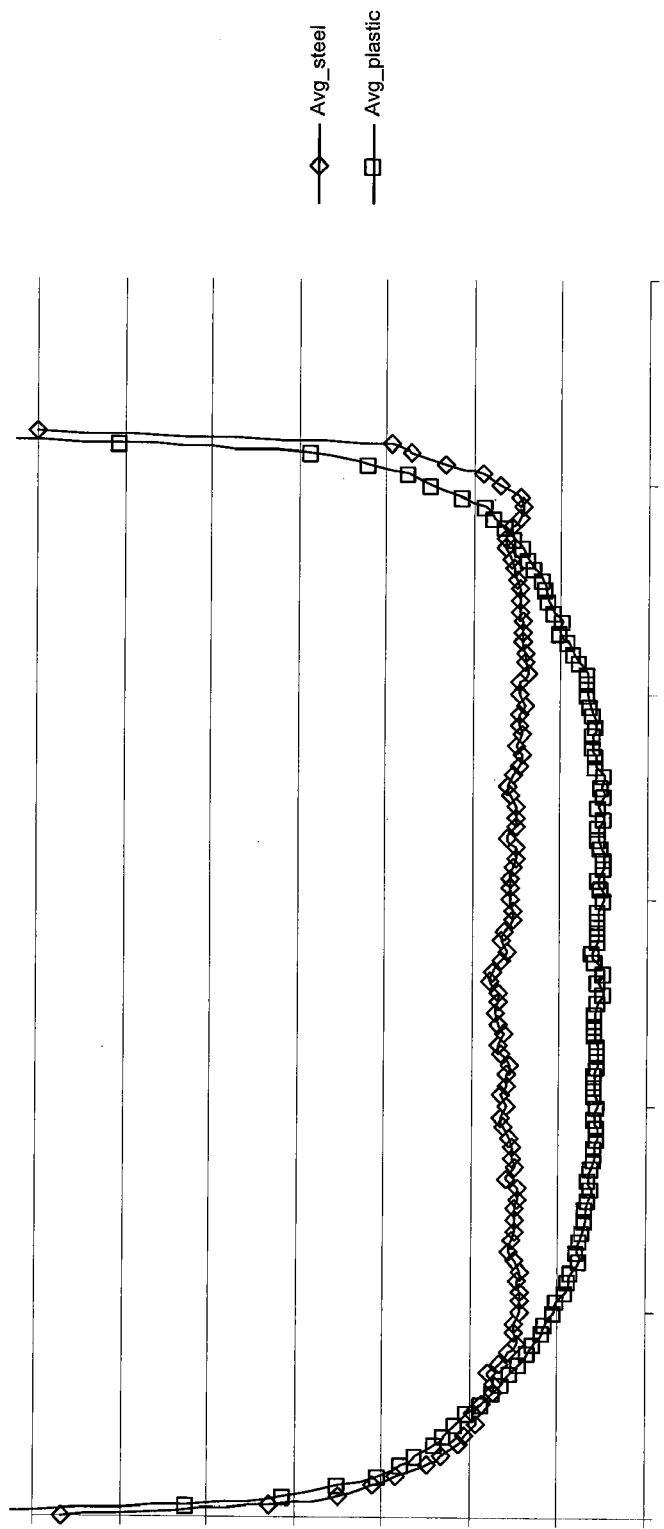
FIG. 7 illustrates temperature variation values for a gas manifold with two lattices—in one case with an inlet section with walls of PMMA and in the other case with an inlet section with walls of steel.

FIG. 7 shows a temperature profile for the same gas manifold and the same lattices (L8-L8) in one case with a PMMA wall of the inlet section 22 and in another case a steel wall for the inlet section 22. As can be seen, a steel inlet section results in a slightly less parabolic nature to the temperature profile which, in certain embodiments, may be desirable.

The below table gives the temperature deviations from a perfect parabolic curve for gas at the top, center and bottom parts at the exiting side of the channel 22 for the best performing lattice combination which is an L8 lattice followed in series by another L8 lattice and a PMMA wall of the inlet section.

| Lattice L8-L8 | Tripple top w.r.t. 6$^{th}$ order parabolic fit (° C.) |
|---|---|
| Top trace | ±0.09 |
| Center trace | ±0.07 |
| Bottom trace | ±0.09 |
| Average | ±0.04 |

As can be seen, the center trace has a variation of ±0.07 from a sixth order parabolic fit to the data. Thus the temperature profile can be seen as being very smooth which is desirable; a smooth variation in temperature can be dealt with.

One measure described in U.S. patent application No. U.S. 61/394,444 which addresses the issue of the presence of streaks removes disturbances originated in the contractor 20. This is achieved by providing an opening 100, for example at an outlet side of the contractor 20. An underpressure is applied to the opening 100 by an underpressure source 102. The underpressure promotes the removal of a boundary layer of gas from a wall of the gas manifold 10, in particular from the wall of the contractor 20. The opening 100 may be alternatively or additionally provided in a wall of the inlet section 22 or at an outlet side of the inlet section 22. At a position in the inlet section 22 the opening 100 would continuously delay disturbance amplification and thereby help in the prevention or reduction of streak formation. Additionally an underpressure could be applied upstream of the contractor 20, halfway along the contractor 20 or any other position or combination of those positions.

The opening 100 may be in the form of a slit or a plurality of holes which extend(s) across the width of the gas manifold (e.g. in the direction perpendicular to the direction of gas flow). In an embodiment the opening 100 is in the form of a slit and has a uniform width.

In an embodiment suction is generated by an underpressure source 102 connected to the opening 100 of the order of a few hundred pascal, for example between 200 and 1,000 pascal. This is effective to remove the developing boundary layer at the end of the contractor 20 and thereby remove disturbances generated in the gas manifold 10 before they can trigger a streak at the end of inlet section 22, at the end of contractor 20 or further upstream.

In an embodiment the underpressure along the length of the slit shaped opening 100 is uniform. The gas flow rate through the opening 100 is in the region of a few percent, for example between 1 and 10%, of the flow through the gas manifold 10.

In an embodiment part of the wall defining the gas flow path, for example part of the wall of the contractor 20 and/or of the inlet section 22 can be provided as a porous wall 110. An underpressure can be applied by an underpressure source 112 to a side of the porous wall 110 opposite to the gas flow. The underpressure developed by the porous wall has a stabilizing effect on the boundary layer of the gas flow. This can help in reducing or even preventing the formation of streaks. The porous wall 110 may be provided at one or more discrete locations on one or both sides of the flow path or all along the length of the contractor 20 and/or inlet section 22.

The porous wall 110 may be comprised of a porous member or may be comprised of a member with an array of holes in it. A hole diameter of 400 µm or less, for example 200 µm (or less) and/or a pitch of 4 mm or less or 2 mm (or less) may be suitable. Further information regarding use of a porous wall may be found in: D. G. MacManus and J. A. Eaton, Measurements and analysis of the flow field induced by suction perforations, J. Fluid Mech. Vol 417, p. 47-75, 2000; J. Goldsmith, Critical laminar suction parameters for suction into an isolated hole or a single row of holes, Northrop Aircraft Report no BLC-95, 1957; and D. G. MacManus and J. A. Eaton, Flow physics of discrete boundary layer suction-measurements and predictions, J. Fluid Mech., vol. 417, p. 47-75, 2000, each of which is incorporated in its entirety by reference.

In one embodiment a sensor 114 to sense streamwise shear stress at or adjacent the porous wall 110 is provided. A controller 116 can use this information, (for example in a feedback or feedforward way) to control the underpressure source 112 (for example by switching one or more valves). In this active control embodiment (which may include generating an overpressure), optical streak control may be achieved. Examples of sensors and a system incorporating such a sensor can be found in: A Elofsson, M Kawakami, P H Alfredsson, Experiments on the stability of streamwise streaks in plane Poiseuille flow, Physics of Fluids, vol 11, no 4, 1999; and F Lundell, P H Alfredsson, Experiments on control of streamwise streaks, European Journal of Mechanics B/Fluids, 22, 2003, 279-290 each of which is hereby incorporated in its entirety by reference.

In an embodiment the gas manifold 10 and/or inlet section 22 is configured to introduce disturbances in the gas through vibrations. In this way a dynamic equilibrium can be achieved and the formation of streaks can be suppressed and/or prevented. In one embodiment the vibrations are introduced in a passive way and in another embodiment the vibrations are induced in an active way.

In the embodiment which introduces vibrations in a passive way, one or more walls (or part of one or more walls) defining the gas flow path, for example walls of the contractor 20 and/or inlet section 22 are made flexible or compliant material (as opposed to rigid). The use of a flexible or compliant material is discussed in: P. W. Carpenter, C. Davies and A. D. Lucey, Hydrodynamics and compliant walls, CURRENT SCIENCE, VOL. 79, NO. 6, 25 Sep. 2000; and J. Hoepffner, A. Bottaro and J. Favier, Mechanisms of non-modal energy amplification in channel flow between compliant walls, Journal of Fluid Mechanics, 2009, each of which are hereby incorporated in their entirety by reference. The wall vibrations are triggered by the flow of gas past the walls. The vibrations introduce additional disturbances into the boundary layer which may disrupt the process of wave amplification which ultimately leads to streak formation. Alternatively the flexible walls may be configured effectively to dampen out disturbances present in the boundary layer before they can trigger streak formation. In one embodiment the flexible walls are comprised of a polymeric material, for example rubber (e.g. latex, silicon, etc.), fluoroelastomer such as Viton fluoroelastomer, a fluorocarbon resin such as PFA fluorocarbon resin, polytetrafluoroethylene such as Teflon polytetrafluoroethylene, styrene-butadiene rubber, a composite, etc. The stiffness of the walls is chosen such that the flow of gas in the manifold leads to the formation of vibrations. Carpenter "Instabilities in a plane channel flow between compliant walls", JFM, 1997, part I and II hereby incorporated in its entirety by reference, discusses how the wall stiffness should be chosen. A spring stiffness of about $1 \times 10^{-4}$ to $1 \times 10^{-3}$ N/m³, a flexural rigidity of about $1 \times 10^{-5}$ to $1 \times 10^{-4}$ Nm and an area density of $1 \times 10^{-3}$ to $2 \times 10^{-2}$ kg/m² are typical.

In an active embodiment, an actuator 120 may be provided to induce vibrations in the z direction of a wall, or part of a wall or both walls which are in the x y plane. A wall vibration can significantly influence the flow behavior, especially in the transitional range of a boundary layer. See, for example, M R Jovanovic, Turbulence suppression in channel flows by small amplitude transverse wall oscillations, Phys Fluids 20, 014101, 2008, hereby incorporated in its entirety by reference. The actuator should be configured to satisfy the following equation $$W = 2\alpha \sin(\omega t),$$

where W is the wall speed, $\alpha$ an amplitude scaling factor and $\omega$ the frequency. For optimal disturbance control, $\omega$ should be chosen such that $\omega = \Omega^* \nu / \delta^2$ with $\nu$ the kinematic viscosity of the gas, $\Omega$ being a frequency scaling factor and equal to about 17.6 and $\delta$ equal to half the width of the channel. In an embodiment, this means $\omega \approx$ 10-20 Hz or 15 Hz. At the same time the amplitude of the vibrations should be about 2-5% of the incoming flow speed (or in other words: $\alpha \approx$ 0.01-0.025 times the flow velocity).

Figure 8:
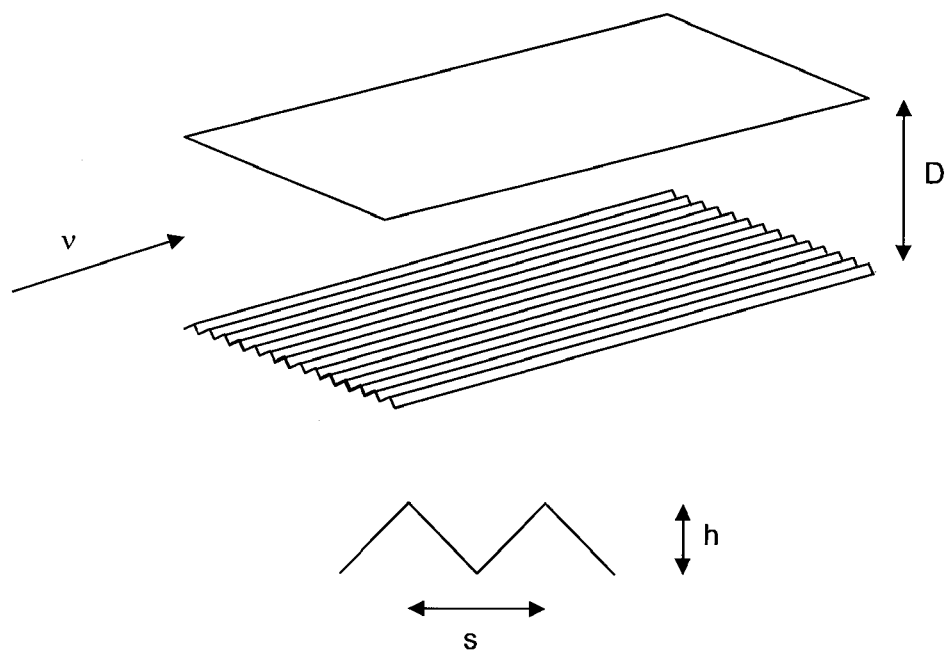
FIG. 8 illustrates schematically projections which may be used on a wall of the gas manifold or on the wall of the inlet section.

In an embodiment, a plurality of elongate projections is provided on a wall of the gas manifold 10 defining the flow path for the gas flow. For example, the plurality of elongate projections can be provided on walls of the contractor 20 and/or inlet section 22. The plurality of elongate projections disrupts the formation of streaks or reduces their coherence once they are formed. This does not introduce excessive additional turbulence or significantly affect the heat transfer power. FIG. 8 illustrates schematically a plurality of projections formed on one or both walls of the gas manifold or the inlet section 22. The walls of the inlet section 22 are separated by distance D.

The projections are elongate in the direction of gas flow. In cross-section the projections have a triangular shape. However, any shape can be used. The presence of the projections weakens streamwise vortices and thereby inhibits spanwise temperature modulation formation. This happens because of the effect of secondary vortices at the projection tips. If a projection height h (e.g. the amount the projections project into the flow path) is between 0.2 and 1.0 mm and the pitch between projections s is between 0.5 and 2.0 mm, the secondary vortices' motion is effectively weakening the streamwise vortices, thereby preventing their amplification. This is described in detail in S. J. Lee and S. H. Lee, Flow Field Analysis of a Turbulent Boundary Layer Over a Riblet Surface, Exp in Fluids 30, 2001, 153-166, hereby incorporated in its entirety by reference.

A typical optimum may be realized for a riblet spacing s+=su$\tau$/v comprised between 10 and 20 and for a h between 0.5s and s. In the definition of s+, v is the kinematic viscosity of the gas and u$\tau$ is the shear velocity. The latter is defined as $(\tau w/\rho)0.5$, with $\tau w$ the wall shear stress and $\rho$ the gas density. For the gas manifold 10, this yields a projection geometry of about s$\approx$1 mm and h$\approx$0.5 mm.

Suppression of spanwise temperature modulation may achieved when the projections are relatively small (e.g. s=1 mm and h=0.5 mm). Coarser projections (e.g. s=2 mm and h=1 mm) tend to introduce a superimposed profile of their own. Typically s may be between 0.5 and 2.0 mm and h between 0.25 and 1 mm.

As described above, formation of streaks leading to phase ripples (i.e. a spanwise modulation in the optical phase) is strongest in a particular range of Reynolds number, around Re$\approx$4000-6000 (for plane Poiseuille flows).

Establishing the desired heat transfer power with air requires a large flow velocity, leading to the transitional and low-turbulent Reynolds number referred to earlier. It is possible to employ a different gas with a higher thermal conductivity to enable a reduction of the flow velocity for the same heat transfer power, e.g., cooling power. The two most prominent candidates in terms of this property are helium and hydrogen, the latter of which may be excluded based on other properties.

Calculations in which some adaptation of the Gnielinski equations has been used yielded a linear or close to linear relation between the Reynolds and Nusselt numbers. It shall be noted here, due to its explicit presence in the calculation of the Nusselt number with the Gnielinski equations, that the Prandtl number difference is only about 5% and in the context of the tremendous differences in the other gas properties can thus be neglected in the first-order approximation. Thus, there exists a somewhat linear relation between the convective heat transfer coefficient and the Reynolds number and thus, by extension, the mass flow (neglecting the difference in dynamic viscosity of about 10%, in the context of the much larger differences in the other properties):

$$Re = \frac{\rho V D_h}{\mu} = \frac{V D_h}{\nu} = \frac{\dot{m} D_h}{\nu A},$$

in which $\rho$ is the fluid density, V the velocity, $D_h$ the hydraulic diameter, $\mu$ the dynamic viscosity, $\nu$ the kinematic viscosity, $\dot{m}$ the mass flow rate and A the flow area.

The thermal conductivity of helium is about 6 times higher than that of air, which means that the heat transfer power increases by this same factor 6. This can be deduced by recalling that the Nusselt number (Nu) is the ratio between the convective and conductive heat transfer:

$$Nu = \frac{hL}{k},$$

in which h is the convective heat transfer coefficient, k the thermal conductivity of the medium and L a characteristic length. Clearly, for the same Nusselt number, the convective heat transfer that the optical component 50 requires increases linearly with the thermal conductivity.

Using helium instead of air allows for a significant reduction in mass flow rate (or, equivalently, Reynolds number) while still meeting the heat transfer power requirements for an unchanged channel geometry (helium's 5 times higher specific heat capacity counters the increased heat pick-up per gram of medium). The flow regime thereby is a much more stable one, in which instabilities should be much less pronounced. As a consequence, the span-wise temperature modulation is of much lower amplitude. Furthermore, because of the fact that the temperature dependency of helium's refractive index is much lower than for air, any temperature ripple will translate to a much lower optical phase ripple.

A disadvantage is the costs associated with helium and to solve that problem, the supply system should be a recirculating one. U.S. patent application No. U.S. 61/394,444 presents a very basic sketch of such a system.

In an embodiment, there is provided a gas manifold to direct a gas flow between at least two parallel plates of an optical component of a lithographic apparatus, the gas manifold comprising: an inlet to provide a gas flow to the gas manifold; a lattice comprising metal and comprising a plurality of through holes to homogenize the gas flow; a contractor downstream of the lattice to reduce the cross sectional area through which the gas flow flows; and an outlet downstream of the contractor to provide the gas flow to the at least two parallel plates.

In an embodiment, there is provided a gas manifold to direct a gas flow between at least two parallel plates of an optical component of a lithographic apparatus, the gas manifold comprising: an inlet to provide a gas flow to the gas manifold; a lattice comprising a plurality of through holes in a regular periodic structure to homogenize the gas flow; a contractor downstream of the lattice to reduce the cross sectional area through which the gas flow flows; and an outlet downstream of the contractor to provide the gas flow to the at least two parallel plates.

In an embodiment, the through holes of the lattice are regularly spaced. In an embodiment, the lattice has a regular weave. In an embodiment, the lattice is rigid. In an embodiment, the lattice has a structural integrity so that the regularity of the through holes is not disturbed by handling of the lattice. In an embodiment, the open area ratio of the lattice is 0.37 or greater, or 0.4 or greater. In an embodiment, the open area ratio of the lattice is less than or equal to 0.7, or less than or equal to 0.6. In an embodiment, the through holes have a hydraulic diameter to filament diameter ratio of 1.0 or greater, 1.4 or greater, or 1.8 or greater. In an embodiment, the through holes have a hydraulic diameter of 70 μm or greater. In an embodiment, the lattice has a thermal conductivity of greater than or equal to 10 W/m/K, or greater than or equal to 20 or 25 W/m/K. In an embodiment, the lattice comprises an austenitic steel, aluminium, aluminium alloy, crystal quartz, ferrite, silica, PTFE, polycarbonate, or a glass ceramic. In an embodiment, the lattice has a mesh size (filaments per inch) of between 160 and 250 inch$^{-1}$ (about 6300 and 9840 filaments per m). In an embodiment, the lattice comprises at least two lattices positioned in series. In an embodiment, the open area ratio of any downstream lattice is at least as high as the open area ratio of any upstream lattice. In an embodiment, a distance between adjacent lattices is at least 0.2 times the hydraulic diameter of the gas manifold at the lattices. In an embodiment, a distance between a lattice and an adjacent component in the flow path of gas in the gas manifold is at least 0.2 times the hydraulic diameter of the gas manifold at the lattice. In an embodiment, the gas manifold further comprises a flow straightener downstream of the inlet to straighten the flow of gas. In an embodiment, the flow straightener is upstream of at least one lattice. In an embodiment, the flow straightener comprises a plurality of passages for the passage of gas therethrough. In an embodiment, the plurality of passages have a length to hydraulic diameter ratio of between 5 and 15, or between 8 and 12. In an embodiment, the passages have a hydraulic diameter of between 0.5 and 1.5 mm. In an embodiment, the gas manifold further comprises a diffuser downstream of the inlet to provide a pressure drop in the gas flow.

In an embodiment, there is provided a module to provide a gas flow between two parallel plates of an optical component of a lithographic apparatus, the module comprising the gas manifold as described herein.

In an embodiment, the module further comprises, between the contractor and the outlet, an inlet section comprising a passage of constant cross-sectional shape. In an embodiment, walls of the inlet section have a thermal conductivity of greater than or equal to 10 W/m/K, or greater than or equal to 20 or 25 W/m/K. In an embodiment, walls of the inlet section are made of metal. In an embodiment, the module further comprises a gas source to provide gas to the inlet to be directed between the two parallel plates. In an embodiment, the gas source is a source of helium. In an embodiment, the module further comprises a capturing device to capture gas exiting from between the two parallel plates. In an embodiment, the module further comprises a recycling device to provide gas captured by the capturing device to the inlet.

In an embodiment, there is provided a lithographic apparatus, comprising: a projection system configured to project a patterned beam of radiation onto a target portion of a substrate; two parallel plates arranged transverse to and in a path of the beam of radiation, wherein at least one of the plates comprises an individually addressable electrical heating device configured locally to heat the plate; and a gas manifold as described herein or a module as described herein to direct a gas flow between the two parallel plates.

In an embodiment, there is provided a device manufacturing method comprising: projecting a patterned beam of radiation onto a target portion of a substrate using a projection system; locally changing an optical path length of the beam of radiation using a plate arranged transverse to and in the path of the beam of radiation, the plate being heated locally; and providing a gas flow through a lattice comprising metal and a plurality of through holes to homogenize the gas flow, a contractor and between the plate and a further plate parallel thereto.

In an embodiment, there is provided a device manufacturing method comprising: projecting a patterned beam of radiation onto a target portion of a substrate using a projection system; locally changing an optical path length of the beam of radiation using a plate arranged transverse to and in the path of the beam of radiation, the plate being heated locally; and providing a gas flow through a lattice comprising a plurality of through holes in a regular periodic structure to homogenize the gas flow, a contractor and between the plate and a further plate parallel thereto.

As will be appreciated, any of the above described features can be used with any other feature and it is not only those combinations explicitly described which are covered in this application.

Although specific reference may be made in this text to the use of a lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before and/or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 365, 248, 193, 157 or 126 nm) as well as g-line and h-line (e.g. having a wavelength of about 436 nm and 405 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A gas manifold to direct a gas flow between at least two parallel plates of an optical component of a lithographic apparatus, the gas manifold comprising:
   an inlet to provide a gas flow to the gas manifold;
   a lattice comprising metal and comprising a plurality of through holes to homogenize the gas flow;
   a contractor downstream of the lattice to reduce the cross sectional area through which the gas flow flows; and
   an outlet downstream of the contractor to provide the gas flow to the at least two parallel plates.

2. The gas manifold of claim 1, wherein the through holes of the lattice are regularly spaced.

3. The gas manifold of claim 1, wherein the lattice has a regular weave.

4. A gas manifold to direct a gas flow between at least two parallel plates of an optical component of a lithographic apparatus, the gas manifold comprising:
   an inlet to provide a gas flow to the gas manifold;
   a lattice comprising a plurality of through holes in a regular periodic structure to homogenize the gas flow;
   a contractor downstream of the lattice to reduce the cross sectional area through which the gas flow flows; and
   an outlet downstream of the contractor to provide the gas flow to the at least two parallel plates.

5. The gas manifold of claim 4, wherein the lattice is rigid.

6. The gas manifold of claim 4, wherein the lattice has a structural integrity so that the regularity of the through holes is not disturbed by handling of the lattice.

7. The gas manifold of claim 4, wherein the lattice comprises an austenitic steel, aluminium, aluminium alloy, crystal quartz, ferrite, silica, PTFE, polycarbonate, or a glass ceramic.

8. The gas manifold of claim 4, wherein the lattice comprises at least two lattices positioned in series.

9. The gas manifold of claim 8, wherein the open area ratio of any downstream lattice is at least as high as the open area ratio of any upstream lattice.

10. The gas manifold of claim 4, wherein a distance between a lattice and an adjacent component in the flow path of gas in the gas manifold is at least 0.2 times the hydraulic diameter of the gas manifold at the lattice.

11. The gas manifold of claim 4, further comprising a flow straightener downstream of the inlet to straighten the flow of gas.

12. The gas manifold of claim 11, wherein the flow straightener is upstream of at least one lattice.

13. The gas manifold of claim 11, wherein the flow straightener comprises a plurality of passages for the passage of gas therethrough.

14. The gas manifold of claim 13, wherein the plurality of passages have a length to hydraulic diameter ratio of between 5 and 15.

15. The gas manifold of claim 13, wherein the passages have a hydraulic diameter of between 0.5 and 1.5 mm.

16. The gas manifold of claim 4, further comprising a diffuser downstream of the inlet to provide a pressure drop in the gas flow.

17. A module to provide a gas flow between at least two parallel plates of an optical component of a lithographic apparatus, the module comprising a gas manifold to direct a gas flow between the at least two parallel plates, the gas manifold comprising:
   an inlet to provide a gas flow to the gas manifold;
   a lattice, the lattice comprising (i) metal and a plurality of through holes to homogenize the gas flow; and/or (ii) a plurality of through holes in a regular periodic structure to homogenize the gas flow;
   a contractor downstream of the lattice to reduce the cross sectional area through which the gas flow flows; and
   an outlet downstream of the contractor to provide the gas flow to the at least two parallel plates.

18. A lithographic apparatus, comprising:
   a projection system configured to project a patterned beam of radiation onto a target portion of a substrate;
   at least two parallel plates arranged transverse to and in a path of the beam of radiation, wherein at least one of the plates comprises an individually addressable electrical heating device configured locally to heat the plate; and
   a gas manifold to direct a gas flow between the at least two parallel plates, the gas manifold comprising:
   an inlet to provide a gas flow to the gas manifold;
   a lattice, the lattice comprising (i) metal and a plurality of through holes to homogenize the gas flow; and/or (ii) a plurality of through holes in a regular periodic structure to homogenize the gas flow;
   a contractor downstream of the lattice to reduce the cross sectional area through which the gas flow flows; and
   an outlet downstream of the contractor to provide the gas flow to the at least two parallel plates.

19. A device manufacturing method comprising:

projecting a patterned beam of radiation onto a target portion of a substrate using a projection system;

locally changing an optical path length of the beam of radiation using a plate arranged transverse to and in the path of the beam of radiation, the plate being heated locally; and providing a gas flow through a lattice comprising metal and a plurality of through holes to homogenize the gas flow, a contractor and between the plate and a further plate parallel thereto.

20. A device manufacturing method comprising:

projecting a patterned beam of radiation onto a target portion of a substrate using a projection system;

locally changing an optical path length of the beam of radiation using a plate arranged transverse to and in the path of the beam of radiation, the plate being heated locally; and providing a gas flow through a lattice comprising a plurality of through holes in a regular periodic structure to homogenize the gas flow, a contractor and between the plate and a further plate parallel thereto.

* * * * *

UNITED STATES PATENT AND TRADEMARK OFFICE
CERTIFICATE OF CORRECTION

| | | |
|---|---|---|
| PATENT NO. | : 8,675,170 B2 | Page 1 of 1 |
| APPLICATION NO. | : 13/406006 | |
| DATED | : March 18, 2014 | |
| INVENTOR(S) | : Frank Johannes Jacobus Van Boxtel et al. | |

It is certified that error appears in the above-identified patent and that said Letters Patent is hereby corrected as shown below:

On Title Page 2, Item (56) References Cited - Other Publications, Column 1, Line 8
replace "pp. 34-45 (2011)"
with --pp. 37-45 (2011)--.

On Title Page 2, Item (56) References Cited - Other Publications, Column 2, Line 32
replace "complaint"
with --compliant--.

Signed and Sealed this
Ninth Day of September, 2014

Michelle K. Lee
*Deputy Director of the United States Patent and Trademark Office*